(12) United States Patent
Elimelech et al.

(10) Patent No.: US 10,893,612 B2
(45) Date of Patent: Jan. 12, 2021

(54) RIGID-FLEXIBLE PRINTED CIRCUIT BORD FABRICATION USING INKJET PRINTING

(71) Applicants: NANO-DIMENSION TECHNOLOGIES, LTD., Nes Ziona (IL); THE IP LAW FIRM OF GUY LEVI, LLC, Wyckokoff, NJ (US)

(72) Inventors: Hila Elimelech, Beer Tuvia (IL); Einav Amit, Jerusalem (IL)

(73) Assignee: Nano Dimension Technologies Ltd., Nes Ziona (IL)

(*) Notice: Subject to any disclaimer, the term of this patent is extended or adjusted under 35 U.S.C. 154(b) by 0 days.

(21) Appl. No.: 16/477,409

(22) PCT Filed: Jan. 11, 2018

(86) PCT No.: PCT/US2018/013370
§ 371 (c)(1),
(2) Date: Jul. 11, 2019

(87) PCT Pub. No.: WO2018/132603
PCT Pub. Date: Jul. 19, 2018

(65) Prior Publication Data
US 2020/0037451 A1 Jan. 30, 2020

Related U.S. Application Data

(60) Provisional application No. 62/445,113, filed on Jan. 11, 2017.

(51) Int. Cl.
*H05K 3/00* (2006.01)
*H05K 1/09* (2006.01)
*H05K 3/12* (2006.01)
*H05K 3/46* (2006.01)
*B33Y 80/00* (2015.01)

(52) U.S. Cl.
CPC ............ *H05K 3/0005* (2013.01); *H05K 1/095* (2013.01); *H05K 1/097* (2013.01); *H05K 3/125* (2013.01); *H05K 3/4691* (2013.01); *B33Y 80/00* (2014.12); *H05K 2203/013* (2013.01); *H05K 2203/1476* (2013.01)

(58) Field of Classification Search
USPC ........................................................ 716/137
See application file for complete search history.

(56) References Cited

U.S. PATENT DOCUMENTS

| | | | | |
|---|---|---|---|---|
| 4,783,670 A | * | 11/1988 | Conta | ................... B41J 2/1429 29/760 |
| 2005/0093922 A1 | | 5/2005 | McGarry et al. | |
| 2011/0272177 A1 | | 11/2011 | Weichslberger et al. | |

FOREIGN PATENT DOCUMENTS

| | | |
|---|---|---|
| WO | 2008102266 A3 | 8/2008 |
| WO | 2017172642 A1 | 10/2017 |

* cited by examiner

*Primary Examiner* — Bryce M Aisaka
(74) *Attorney, Agent, or Firm* — Guy Levi; The IP Law Firm of Guy Levi, LLC

(57) ABSTRACT

The disclosure relates to methods and compositions for direct printing of rigid flexible electronic objects. Specifically, the disclosure relates to methods, systems and compositions for the direct, optionally simultaneous inkjet printing of rigid-flexible electronics, for example, rigid-flexible PCBs, FPCs, TFTs, antennae solar cells, RFIDs and the like, using a combination of print heads with flexible and rigid conductive and dielectric ink compositions.

17 Claims, 6 Drawing Sheets

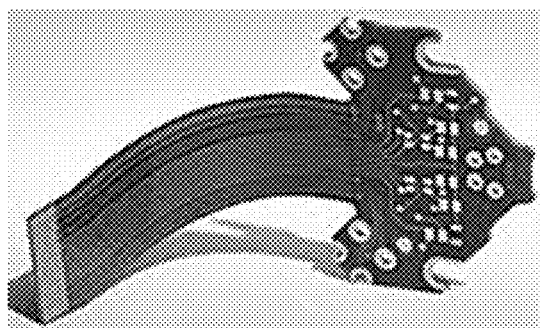 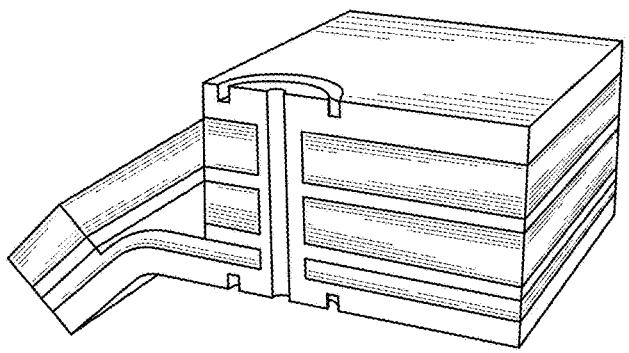
FIG. 1A          FIG. 1B
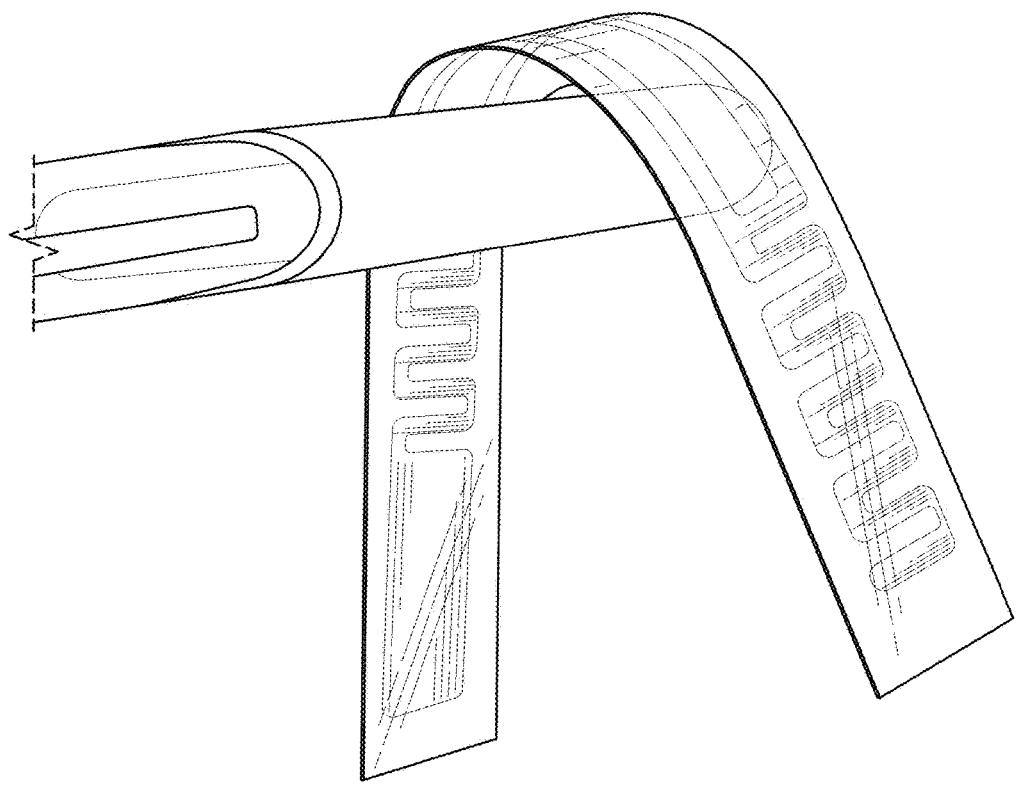
FIG. 2

RIGID-FLEXIBLE PRINTED CIRCUIT BORD FABRICATION USING INKJET PRINTING

CROSS REFERENCE TO RELATED APPLICATIONS

This patent application is a U.S. National Phase filing of commonly owned and pending PCT Application No. PCT/US18/13370, filed Jan. 11, 2018, which is based on and claims the benefit of the filing date of now expired US Provisional Patent Application Serial No. 62/445,113, filed Jan. 11, 2017, both which are incorporated herein by reference in their entirely.

BACKGROUND

The disclosure is directed to methods and compositions for direct printing of rigid flexible printed circuit board. Specifically, the disclosure is directed to methods and compositions for the direct inkjet printing of rigid-flexible circuit board and/or flexible electronics using a combination of print heads with flexible and rigid conductive and dielectric ink compositions.

Flexible-rigid composite electronics represent a new generation of electronics, which can exhibit properties of both stretching as well as bending flexibility. These properties will afford electronic devices with conformity to bending and twisting as well as the capability to stretch and compress over a large strain scale. Because of their soft and conformable nature, stretchable electronics have shown great potential in biomedical engineering, e.g., epidermal electronic devices and implantable devices. As well as in the growing demand for wearable electronics, and other industries such as sensors, antennas with complex geometry or RFIDs to be placed on curved objects.

Progress in the field of flexible electronics is expected to play a critical role in a number of important emerging technologies. For example, flexible sensor arrays, electronic paper, wearable electronic devices, and large area flexible active matrix displays. In addition, development of flexible integrated electronic systems and processing methods is also expected to significantly impact several other important technologies including micro- and nano-fluidics, sensors and smart skins, radio-frequency identification systems (RFID), information storage, and micro- and nanoelectromechanical systems. The success of these applications of flexible electronics technology depends however, on the continued development of new materials, and commercially feasible and scalable fabrication pathways for making integrated electronic circuits and devices exhibiting good electronic, mechanical and optical properties in flexed, deformed and bent conformations.

Flexible electronics, refers currently to a technology for building electronic circuits by depositing electronic devices onto flexible substrates. Fabricating flexible electronics, with performance that is equal to conventional (rigid) microelectronics built on brittle semiconductor wafers, but capable of optical transparency, being light-weight, stretchable/bendable formats and easy to print rapidly over large areas has been shown to enable diverse applications, such as flexible display, thin film solar cell, large area sensors and actuators. In all of these applications, the flexibility of both the circuit and the components incorporated on them, represents the main differences from typically rigid circuits. To-date, it has proven to be a challenge to design a bendable (governed by Young's modulus, a modulus of elasticity describing a material property or parameter which is equal to a ratio between a mechanical tension and a corresponding elongation and thus a measure of the stiffness of a material) and stretchable (governed by Poisson ratio, referring to the measurement of the relative change in width with a change in length, or the tendency of the component to "neck in" during stretching) electronics based on inorganic materials due to their small fracture strain (high Young's modulus and Poisson ratio of 1). A typical embodiment of flexible electronics are thin films of the inorganics are adopted as semiconductors, conductors and/or insulators on substrates to minimize the strains induced by bending or stretching. Another embodiment is represented by circuits in wavy patterns, which can offer fully reversible stretchable/compressibility without substantial strains in the circuit materials themselves.

Provided herein, is a flexible and/or stretchable/bendable rigid-flex two or three-dimensional flexible electronics that consists of organic and/or metallic material for the manufacturing of electronic devices/connectors/printed circuit boards/antennas/sensors/RFIDs etc. The term "bendable" refers to a mechanical property indicating the ability of a material, structure, device or device component to be deformed into a curved shape (see e.g., FIGS. 2-4C) without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 300% Likewise, "extensible" and "stretchable" can be used synonymously in the present description and refer to the ability of a material, structure, device or device component to be strained without undergoing fracture. Some stretchable materials, structures and devices of the present invention are capable of exhibiting at least some expansion and/or compression without mechanical failure. In one embodiment, a stretchable structure of the present invention is capable of undergoing a change in its overall footprint area by about 5% along a given direction, and in some embodiments along two directions such as directions oriented orthogonal to each other. Stretchablility in some embodiments is caused by elements of structures of the materials used that are capable of movement or displacement in relative to each other.

Flexible-rigid composite object (Flexible-rigid electronics) represents a hybrid composite, in which a single whole product, is composed of both flexible and rigid components, where each of them, or both, consists of either organic or metallic material, or both. The ability to form such rigid-flex electronic devices may address one of the major issues of the electronic industry known as Moore Law, which states that the number of transistors in a dense integrated circuit doubles approximately every two years. This projection resulted in enlarging the space occupied by integrated circuits. However, where the space occupied by the electronic device is limited, such as for implanted medical devices, necessitates folding the device, or the ability to produce the electronic device in a complex three-dimensional geometry, which is of high surface area and low space occupation.

Flexible-rigid composite circuit board represents a hybrid composite of printed circuit boards, (PCB), in which flexible and rigid circuit boards are connected to one another to form a single composite circuit board. The various layers of a multilayer flexible-rigid circuit board composite are typically connected via metallically coated through openings.

The fastening of flexible connecting bridges to rigid or stiffened PCBs is typically performed to utilize the advantages of packaging, i.e., construction and connection technology, with flexible substrates in costly electronic components, in which significantly more cost-effective rigid circuit boards are used for reasons of cost. Such a connection step, typically by means of hot bar soldering or laser soldering, is performed in discrete steps, circuit by circuit.

The additional handling and positioning of isolated flexible connecting bridges and PCB structures is difficult to automate, which results in high production costs and decreases the cycle time for the production of the flexible connections. In small PCB structures, as are used in medical implants, these problems are increased still further. Further issues are delamination and contact deterioration in repeated use when straining the flexible repeatedly.

The present disclosure is directed toward overcoming one or more of the above-identified problems.

SUMMARY

Disclosed, in various embodiments, are systems, methods and compositions for the direct inkjet printing of rigid-flexible electronics and/or flexible conductors using a combination of print heads with flexible and rigid conductive and dielectric ink compositions.

In an embodiment provided herein is a method for fabricating a rigid-flexible electronic object using inkjet printer comprising: providing an ink jet printing system comprising: a first print head having: at least one aperture, a rigid resin ink reservoir, and a rigid resin pump configured to supply rigid resin inkjet ink through the aperture; a second print head having: at least one aperture, a rigid metallic ink reservoir, and a rigid metallic ink pump configured to supply the rigid metallic inkjet ink through the aperture; a third print head having: at least one aperture, a flexible resin ink reservoir, and a flexible resin ink pump configured to supply the flexible resin inkjet ink through the aperture; a fourth print head having: at least one aperture, a flexible conductive ink reservoir, and a flexible conductive ink pump configured to supply the flexible conductive inkjet ink through the aperture; a conveyor, operably coupled to the first, the second, the third, and the fourth print heads configured to convey a substrate to each of the first, second, third, and fourth print heads; and a computer aided manufacturing ("CAM") module, comprising: a data processor; a non-volatile memory; and a set of executable instructions stored on the non-volatile memory for: receiving a 2D or 3D visualization file representing the rigid-flexible electronic object; generating a file that represents at least one, substantially 2D layer for printing the rigid-flexible electronic object; receiving a selection of parameters related to the rigid-flexible electronic object; and altering the file represents at least one, substantially 2D layer based on at least one of the selection of parameters, wherein the CAM module is configured to control each of the first, second, third and fourth print heads; providing the rigid resin inkjet ink composition, the rigid metallic inkjet ink composition, the flexible resin ink composition, and the flexible conductive ink composition; using the CAM module, obtaining a generated file representing a first, substantially 2D layer of the rigid-flexible electronic object for printing, the 2D layer comprising a pattern representative of the rigid resin inkjet ink, the rigid metallic inkjet ink, the flexible resin inkjet ink, the flexible conductive inkjet ink, or a combination comprising two or more; using the first print head, forming the pattern corresponding to the rigid resin representation in the first, substantially 2D layer of the rigid-flexible electronic object for printing; curing the pattern corresponding to the rigid resin representation in the 2D layer of the rigid-flexible electronic object; using the third print head, forming the pattern corresponding to the flexible resin representation in the first, substantially 2D layer of the rigid-flexible electronic object for printing; solidifying the pattern corresponding to the flexible resin representation in the 2D layer of the rigid-flexible electronic object; using the second print head, forming the pattern corresponding to the rigid metallic ink representation in the first, substantially 2D layer of the rigid-flexible electronic object for printing; solidifying the pattern corresponding to the rigid metallic ink representation in the first, substantially 2D layer of the rigid-flexible electronic object for printing; using the fourth print head, forming the pattern corresponding to the flexible conductive ink representation in the first, substantially 2D layer of the rigid-flexible electronic object printing; and solidifying the pattern corresponding to the flexible conductive representation in the 2D layer of the rigid-flexible electronic object.

In another embodiment, the rigid resin ink can be a mixture of photopolymerizable monomers, oligomers or their combination, a colloidal dispersion of high-molecular weight polymers, a polymer solution or a combination thereof, in a dedicated print head having either a single rigid resin ink composition, or with a dedicated additional print head with a separate rigid resin ink that is different or the same as the first rigid resin ink.

In an embodiment, the rigid metallic ink can be a dispersion of metallic nanoparticles in solvent or a metallic precursor solution or dispersion or a combination thereof.

In yet another embodiment, the inkjet printing system further comprises additional print head having: at least one aperture, a second rigid or flexible resin ink reservoir, and a second rigid or flexible resin ink pump configured to supply the second rigid or flexible resin ink through the aperture, the method further comprising: providing a second rigid or flexible resin ink composition; using the second rigid or flexible resin ink print head, forming a predetermined pattern corresponding to the second rigid or flexible resin representation in the first, substantially 2D layer of the rigid-flexible electronic object for printing; and curing or crosslinking or functionalizing or solidifying the predetermined pattern corresponding to the second rigid or flexible resin representation in the 2D layer of the rigid-flexible electronic object, wherein the second rigid or flexible resin ink composition has a different rigid or flexible resin composition than the rigid or flexible resin ink composition in the first or second print head.

These and other features of the methods and compositions for using inkjet printing for fabricating rigid-flexible objects and/or rigid-flexible electronic objects, will become apparent from the following detailed description when read in conjunction with the figures and examples, which are exemplary, not limiting.

BRIEF DESCRIPTION OF THE FIGURES

For a better understanding of the colored resin-metal fabrication methods and compositions, with regard to the embodiments thereof, reference is made to the accompanying examples and figures, in which:

FIG. 1A, illustrates a flexible PCB where conductive metallic pattern is printed with a flexible resin, with a schematic cross section thereof illustrated in FIG. 1BA;

FIG. 2 illustrates a flexible conductor, where a metallic pattern is printed upon a flexible resin.

DETAILED DESCRIPTION

Figure 3:
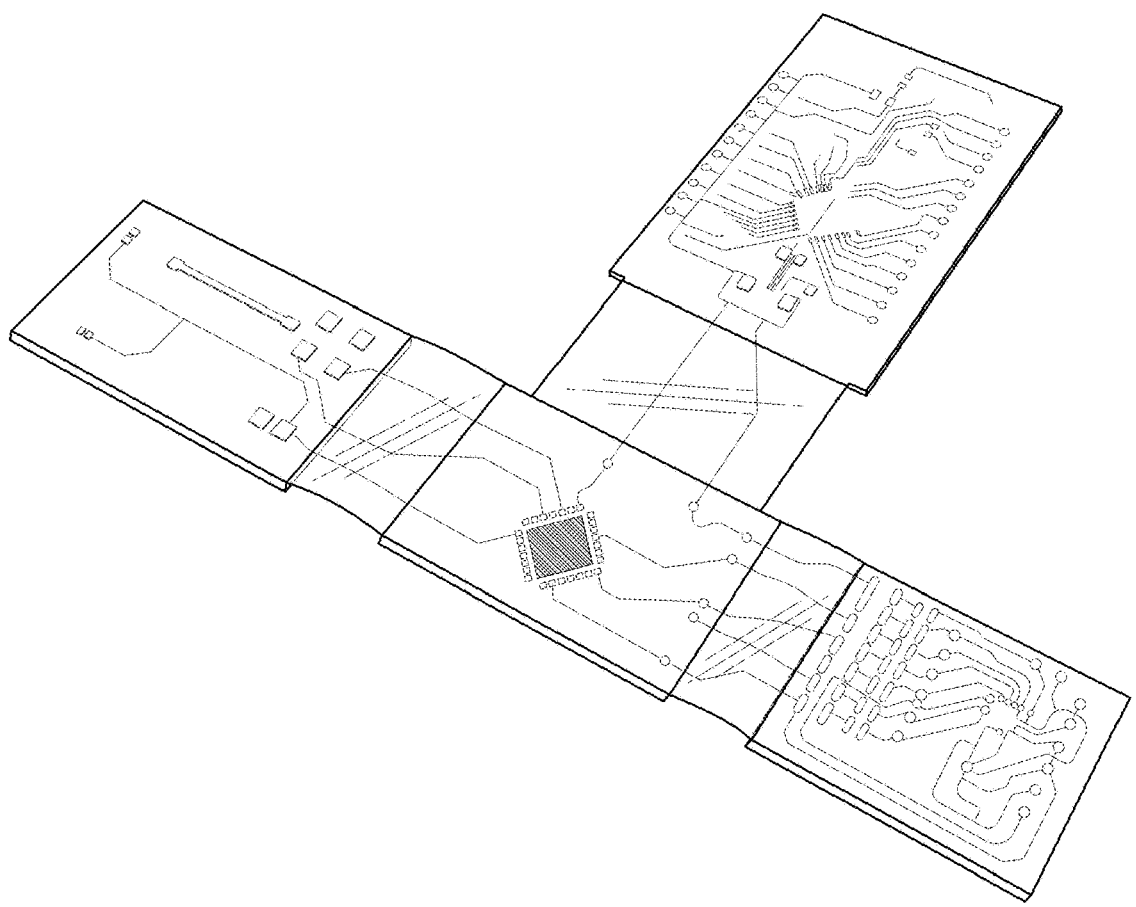
FIG. 3 illustrates a T-shaped rigid-flexible-rigid PCB fabricated using the systems, methods and compositions provided hereinbelow, with four rigid sections connected by three flexible portions.
Figure 4A:
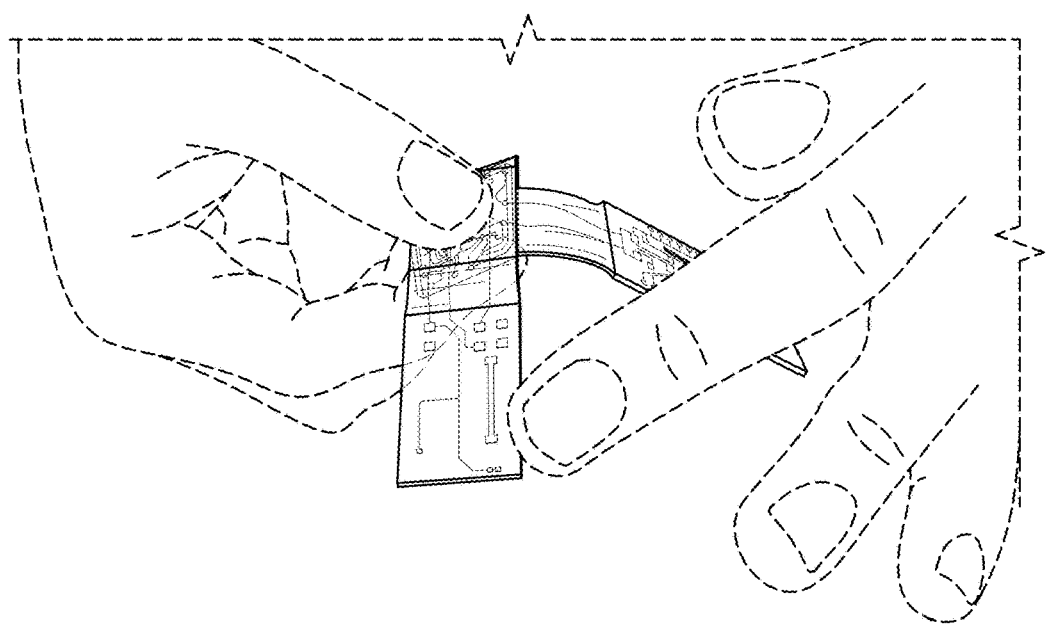
FIG. 4A, illustrating bendability of the rigid portion on the tip of the T leg, where bendability of the cross arms at up to 90° illustrated in FIG. 4B and of all flexible portion at up to 90° illustrated in FIG. 4C.
Figure 4B:
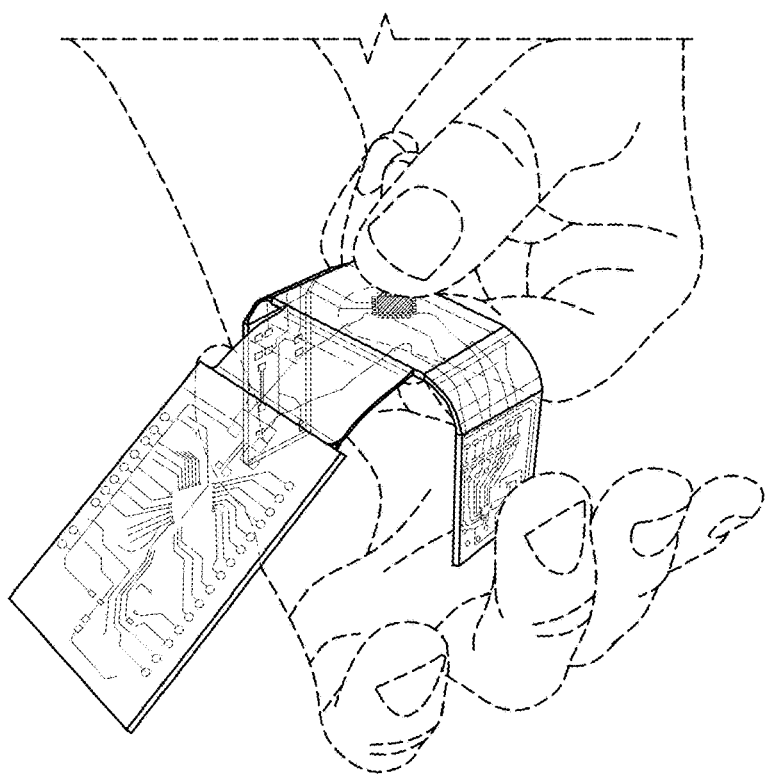
Figure 4C:
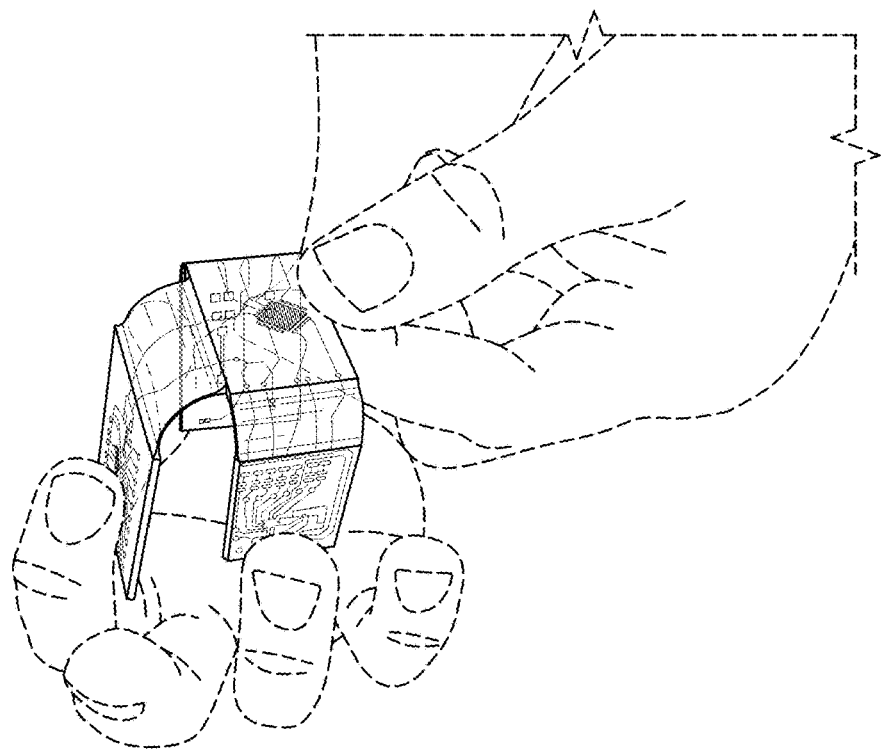

Provided herein are embodiments of methods and compositions for the direct inkjet printing of rigid-flexible objects and/or flexible electronics using a combination of print heads with flexible and rigid conductive and dielectric ink compositions.

The fastening of flexible connecting bridges to rigid or stiffened PCBs is typically performed to utilize the advantages of packaging, i.e., construction and connection technology, with flexible substrates in costly electronic components, in which significantly more cost-effective rigid circuit boards are used for reasons of cost. Such a connection step, typically by means of hot bar soldering or laser soldering, is performed in discrete steps, circuit by circuit.

The additional handling and positioning of isolated flexible connecting bridges and PCB structures is difficult to automate, which results in high production costs and decreases the cycle time for the production of the flexible connections. In small PCB structures, as are used in medical implants, these problems are increased still further.

The major considerations in the fabrications of rigid-flexible electronics components, are cost, throughput, achievable feature size, and compatibility with materials used in each portion (i.e., the rigid and the flexible portions of the electronic components). Fabrication of flexible electronics (e.g., TFTs, sensors etc.), present continuing challenges associated with conductive materials (traces). For example, high-resolution patterning techniques for defining the length between the source and target are critical for fabrication of TFTs (thin-film transistors), due to its influences on current output, the switching speed and so on. Current techniques, mostly relying on selective lithography, although having high resolution, are not well suited to rigid-flexible electronics, because their process is very complex, expensive, time consuming, wasteful, and only suitable for patterning of small areas. Moreover, it requires many steps with resists, solvents and developers, which may be incompatible with plastic substrates. Furthermore, etching the underlying layers and removing the photo-resist can destroy the activity of most organic electronic materials and polymeric substrates.

The printing methods disclosed herein, implement depositing and patterning materials in one single step. Currently, there are mainly two kinds of printing methods: (1) Transfer and bonding of completed circuits to a flexible substrate, such as transfer printing; (2) fabrication of the circuits directly on the flexible substrate, such as inkjet printing and micro-contact printing (soft lithography). In transfer printing, the whole structure is fabricated by standard methods on a Si wafer or a glass plate then transferred to a flexible substrate, which have the advantage of providing high-performance devices on flexible substrates. It mainly benefits from high-resolution lithography and high-temperature deposit technology. Its drawbacks are small surface area coverage and high cost comparable with optical lithography. Micro-contact printing creates multi-level patterns used as masks, and is compatible with high-throughput batch or Roll-to-Roll (R2R) technology. Typical printing methods currently do not involve the direct (and optionally simultaneous) printing of rigid portion and flexible portions (conducting and/or dielectric) directly on a disposable substrate or a chuck (or support powder) without either support or substrate as disclosed and claimed herein.

In an embodiment, using the compositions, methods and printing systems disclosed herein can allow: noncontact patterning, low temperature process, additive patterning, real-time adjustment, three-dimensional structuring, easy to register, printability of organics/inorganic materials, at low cost, being compatible with large area and high-throughput processing. Inkjet printing using the method described herein has the advantage of, for example, in circumstance whereby the pattern quality is no longer limited by the depth of focus of the optics. The methods, compositions and systems described herein can have excellent compatibility with organic and inorganic materials. Moreover, being a data/computer driven process, the methods, compositions and systems described herein can directly fabricate devices from CAD/CAM. It can register dynamically over large areas and align the various electronics, whether flexible or rigid in real-time align. As a noncontact patterning, the methods, compositions and systems described herein can be adapted minimize contamination. Imperfections such as localized and layer-to-layer distortion in the stack are largely non-existent due to the simultaneous patterning of the combined flexible and rigid portion at a high nanoscale resolution. The methods, compositions and systems described herein provide a drop-on-demand (DOD) process without the need for a physical masks and material is only applied where it is needed in the amount needed. Furthermore, the methods, compositions and systems described herein can allow a user to design and rapidly fabricate rigid-flexible electronic objects with complex three-dimensional shapes. And the microstructure can be changed rapidly through software-based printer-control systems.

The methods described herein can be used to form/fabricate the rigid-flexible electronic object s and/or flexible electronics using a combination of print heads with flexible and rigid conductive and dielectric ink compositions in a continuous additive manufacturing process using the inkjet printing device, or using several passes. Using the methods described herein, a thermoset rigid resin material can be used to form the rigid resin portion of the composite component, which is typically formed simultaneously in one embodiment, or separately colored in another embodiment, with a flexible portion, each again, either separately or simultaneously with rigid conductive metal trace or a flexible conductive material, forming a flexible conductive pattern or trace or contact. These components. Using the methods and compositions described herein, that separate fabrication and assembly can be eliminated and, using the methods and compositions described herein, better control over complex geometries and rapid prototyping as well as mass production of rigid-flex electronics can be achieved.

Accordingly and in an embodiment, provided herein is a method for directly onto a disposable peelable or removable substrate, fabricating a rigid-flexible electronic component using inkjet printing printer comprising: providing an ink jet printing system comprising: a first print head having: at least one aperture, a rigid resin ink reservoir, and a rigid resin pump configured to supply rigid resin inkjet ink through the aperture; a second print head having: at least one aperture, a rigid metallic ink reservoir, and a rigid metallic ink pump configured to supply the rigid metallic inkjet ink through the aperture; a third print head having: at least one aperture, a flexible resin ink reservoir, and a flexible resin ink pump configured to supply the flexible resin inkjet ink through the aperture; a fourth print head having: at least one aperture, a flexible conductive ink reservoir, and a flexible conductive ink pump configured to supply the flexible conductive inkjet ink through the aperture; a conveyor, operably coupled to the first, the second, the third, and the fourth print heads configured to convey a substrate to each of the first, second, third, and fourth print heads; and a computer aided manufacturing ("CAM") module, comprising: a data processor; a non-volatile memory; and a set of executable instructions stored on the non-volatile memory for: receiving a 3D visualization file representing the rigid-flexible electronic object; generating a file that represents at least one, substantially 2D layer for printing the rigid-flexible electronic object; receiving a selection of parameters related to the rigid-flexible electronic object; and altering the file represents at least one, substantially 2D layer based on at least one of the selection of parameters, wherein the CAM module is configured to control each of the first, second, third and fourth print heads; providing the rigid resin inkjet ink composition, the rigid metallic inkjet ink composition, the flexible resin ink composition, and the flexible conductive ink composition; using the CAM module, obtaining a generated file representing a first, substantially 2D layer of the rigid-flexible electronic object for printing, the 2D layer comprising a pattern representative of the rigid resin inkjet ink, the rigid metallic inkjet ink, the flexible resin inkjet ink, the flexible conductive inkjet ink, or a combination comprising two or more; using the first print head, forming the pattern corresponding to the rigid resin representation in the first, substantially 2D layer of the rigid-flexible electronic object for printing; curing the pattern corresponding to the rigid resin representation in the 2D layer of the rigid-flexible electronic object; using the third print head, forming the pattern corresponding to the flexible resin representation in the first, substantially 2D layer of the rigid-flexible electronic object for printing; solidifying the pattern corresponding to the flexible resin representation in the 2D layer of the rigid-flexible electronic object; using the second print head, forming the pattern corresponding to the rigid metallic ink representation in the first, substantially 2D layer of the rigid-flexible electronic object for printing; sintering the pattern corresponding to the rigid metallic ink representation in the first, substantially 2D layer of the rigid-flexible electronic object for printing; using the fourth print head, forming the pattern corresponding to the flexible conductive ink representation in the first, substantially 2D layer of the rigid-flexible electronic object for printing; and cross-linking the pattern corresponding to the flexible conductive representation in the 2D layer of the rigid-flexible electronic object.

As used herein, cross-linking is used as a general term to describe the functionalization of the flexible resin, whether the conductive resin or the flexible dielectric resin, in other words, in a limited fashion, connecting via one or more linkages elsewhere along a long-chain branch precursor (that is, not an endgroup) to form the heteromorphic long chain branched composition rather than a crosslinked network. Functionalizing can also be through initiating polymerization of branched polymers in a multi-functional polymer with substituted reactant in either the polymer backbone, or in functional groups not part of the polymer backbone. Controlling the branching can be done, for example, by controlling: the polymer number average molecular weight, the concentration of (photo)initiators, UV exposure times, temperature, type of initiators and the like. Branching can be for example, long-chain branching (LCB), meaning a chain length of at least 6 carbons, above which the length cannot be distinguished using $^{13}C$ nuclear magnetic resonance spectroscopy. Each long chain branch has the same comonomer distribution as the polymer backbone and can be as long as the polymer backbone to which it is attached.

The term "rigid", in reference to "rigid resin" or "rigid portion" of the "rigid-flexible" or "rigid-flexible-rigid" electronic objects described herein or rigid portions thereof; is used herein to mean a material that keeps it shape on its own and that does not deform significantly as a result of its own weight when performed by inkjet printing or when confined in by flexible portions (e.g., flexible resin component and/or flexible conductive resin portions), and in which Young's modulus $\lambda$ is greater than 200 MPa, unlike a gel, which remains extremely flexible and which has a Young's modulus that is practically zero. The Young's modulus for the materials provided herein, can be between about 1 and about 3 mPa, or between about 1.5 mPa and about 2.7 mPa. Moreover, the term "flexible printed circuit" should include both a relatively thin sheet-shaped printed circuit and a relatively thick board-shaped printed circuit. The flexible printed circuit may also be called a "flexible printed circuit cable (FPCC)" Also, the term "flexible" as used herein to describe the various layers of the rigid-flexible electronic objects described herein, is intended to mean that the materials remain substantially flaccid, and have the ability to be conformed to two- or three-dimensional features in a substantially uniform fashion. Accordingly, the term "flexible" and like terms indicates the modulus in bending of the resin polyester elastomer is preferably 10000 kgf/cm$^2$ or less. Virtually any desired modulus in bending falling within the above-described definition can be achieved by selectively regulating the structural arrangement of the elastomers provided herein by selectively varying the type and/or amounts of the co-monomeric components that are used during polymerization and the degree of crosslinking.

Alternatively, or additionally, the inkjet printing system used in the methods and systems for fabricating rigid-flexible, or rigid-flexible-rigid electronic objects (e.g., rigid-flexible-rigid PCB and/or FPC), can further comprises additional print head having: at least one aperture, a second rigid or flexible resin ink reservoir, and a second rigid or flexible resin ink pump configured to supply the second rigid or flexible resin ink through the aperture, the method further comprising: providing a second rigid or flexible resin ink composition; using the second rigid or flexible resin ink print head, forming a predetermined pattern corresponding to the second rigid or flexible resin representation in the first, substantially 2D layer of the rigid-flexible electronic object for printing; and curing or crosslinking or functionalizing or solidifying the predetermined pattern corresponding to the second rigid or flexible resin representation in the 2D layer of the rigid-flexible electronic object, wherein the second rigid or flexible resin ink composition has a different rigid or flexible resin composition than the rigid or flexible resin ink composition in the first or second print head. Also encompassed are circumstances an embodiments where additional print heads each dedicated for a particular ink type are added on demand based on the type of electronic component, the application and its use conditions.

Furthermore, the methods of forming the rigid-flexible and/or rigid-flexible-rigid electronic objects described herein can further comprise a step of providing a peelable, or removable substrate, prior to the step of using the first print head, and/or the second print head. The optional peelable substrate can also be either rigid or flexible. The term "peelable" refers in an embodiment to materials that can be removably applied to and adhere to surfaces such as the surface created by the method, compositions and kits for forming rigid-flexible and/or rigid-flexible-rigid electronic objects described herein and can be subsequently removed from that surface by force. Peelable films according to the compositions and methods of this invention can be adhesively and removably applied to a chuck disposed on the printer's conveyor belt and, by virtue of being forcibly removed, expose a layer of the rigid-flexible and/or rigid-flexible-rigid electronic objects described herein.

The removable substrate can also be a powder, for example, a ceramic powder, which can be applied to the chuck, compacted and later removed. The choice of substrate can depend, for example on the final composite components' use and structure. Furthermore, the removal of the substrate can take place at the end of the fabrication of the whole component, the fabrication of the first 2D layer, or at any stage in between.

The method of forming the rigid-flexible and/or rigid-flexible-rigid electronic objects described herein can, as described above, comprise the step of providing a substrate. The print head (and derivatives thereof; are to be understood to refer to any device or technique that deposits, transfers or creates material on a surface in a controlled manner) depositing the resin and/or metallic ink can be configured to provide the ink droplet(s) upon demand, in other words, as a function of various preselected process parameters such as conveyor speed, desired flexible conductive layer thickness and/or length, layer type, layer flexibility required (in other words, how far should the component bend relative to the initial 2D configuration) and the like. The removable or peelable substrate can also be a relatively rigid material, for example, glass or crystal (e.g., sapphire). Additionally, or alternatively, the peelable substrate may be a flexible (e.g., rollable) substrate (or film) to allow for an easy peeling of the substrate from the rigid-flexible, or rigid-flexible-rigid electronic objects, for example, poly(ethylenenaphthalate) (PEN), polyimide (e.g. KAPTONE® by DuPont), silicon polymers, poly(ethyleneterphtalate) (PET, both cPET or aPET), poly(tetrafluoroethylene) (PTFE) films etc. Moreover, the substrate can be, for example a ceramic powder.

In fabricating or forming the rigid-flexible, or rigid-flexible-rigid electronic objects articles and components described herein, by depositing substantially 2D layers of a rigid or flexible component resin and/or rigid metal materials or flexible conductive materials, supporting layers or structures can be deposited as part of the substantial 2D representation of the rigid-flexible, or rigid-flexible-rigid electronic objects articles and components described herein. This support can be removable and be positioned underneath subsequently printed overhanging portions or in prospective cavities, which are not supported by the part or component material itself. A support structure may be built utilizing the same deposition techniques by which the part material is deposited. In an embodiment, the CAM module can generate additional geometry acting as a support structure for the overhanging or free-space segments of the 3D visualization file representing the composite component being formed, and in other circumstances, for the sidewalls of the rigid-flexible and/or rigid-flexible-rigid electronic objects described herein and components being formed. The support material can be configured to, for example, adhere to the part material during fabrication, and be removable from the completed rigid-flexible and/or rigid-flexible-rigid electronic objects and components described herein when the printing process is completed.

The term "support" as used herein refers to one or more layers of a support material used to provide structural support to the plurality of layers of built colored resin and/or metal materials, during the fabrication of the rigid-flexible and/or rigid-flexible-rigid electronic objects described herein and components described herein. For example, the support material can be a wax including at least one functional group capable of reacting with the resin ink material, when exposed to the actinic radiation used for curing of the resin ink material. In some embodiments, the functional group in the wax is capable of reacting with the build material in the presence of a photoinitiator typically used for curing of the build material, and subsequent formation of the 3D article and later melted under mild heating and removed. Additional support materials can be, for example, non cross-linked, solvent/water soluble material, which allows support structures to be relatively easily washed away— once the print process is complete. Alternatively or additionally, breakaway support materials can also be possible, which can be removed by manually snapping them off the part.

In other embodiments, the support material used in the methods and systems for fabricating rigid-flexible and/or rigid-flexible-rigid electronic objects and components described herein can be transparent to actinic radiation to accommodate" exposure through the support. In an embodiment, "actinic radiation" refers to an energy beam capable of curing a resin ink composition such as any electromagnetic irradiation, e.g., infrared, ultraviolet ray, electron beam, X-ray or radial ray. Accordingly, the term "actinic radiation-curable resin composition" to be used in producing the rigid-flexible and/or rigid-flexible-rigid electronic objects described herein and components described herein, can be a resin composition which is cured upon irradiation with one or more actinic radiations (energy beams) as described above.

Such irradiation results in curing at least a part of the photopolymerizable rigid resin ink composition in the layers nearest to the support, or additionally (or alternatively) be used to solidify the flexible resin. Examples of suitable support materials include polymeric films such as those formed by addition polymers and linear condensation polymers and transparent foams. Polymeric supports for use in the methods described herein, can be cellulose acetate propionate, cellulose acetate butyrate, polyesters such as polyethylene terephthalate (PET) and polyethylene naphthalate (PEN); oriented polystyrene (OPS); oriented nylon (ONy); polypropylene (PP), oriented polypropylene (OPP); polyvinyl chloride (PVC); and various polyamides, polycarbonates, polyimides, polyolefins, poly(vinylacetals), polyethers and polysulfonamides, and opaque white polyesters. Acrylic resins, phenol resins, glass and metals may also be used as an ink-receiver.

Accordingly and in an embodiment, the inkjet printing system used in the methods and systems for fabricating rigid-flexible and/or rigid-flexible-rigid electronic objects and components can further comprise additional print head having: at least one aperture, a support ink reservoir, and a support ink pump configured to supply the support ink through the aperture, the method further comprising: providing a support ink composition; before, simultaneously with, or subsequent to the step of using the first print head and/or the second and/or the third print heads and/or the fourth print head, using the support ink print head, forming a predetermined pattern corresponding to the support representation in the first, substantially 2D layer of the rigid-flexible electronic object for printing; and functionalizing the predetermined pattern corresponding to the support representation in the 2D layer of the rigid-flexible electronic object.

The term "forming" (and its variants "formed", etc.) refers in an embodiment to pumping, injecting, pouring, releasing, displacing, spotting, circulating, or otherwise placing a fluid or material (e.g., the rigid metallic ink) in contact with another material (e.g., the substrate, the resin or another layer) using any suitable manner known in the art.

Curing the rigid resin layer or pattern deposited by the appropriate print head as described herein, can be achieved by, for example, heating, photopolymerizing, drying, depositing plasma, annealing, facilitating redox reaction, irradiation by ultraviolet beam or a combination comprising one or more of the foregoing. The same methodology is used under the proper conditions, to solidifying the flexible resin and effect the material to remain in the rubbery state without collapse. Curing does not need to be carried out with a single process and can involve several processes either simultaneously or sequentially, (e.g., drying and heating and depositing crosslinking agent with an additional print head)

In general, the rigid resin will have a glass transition that is higher than the operating temperature the electronic component or flexible electronic objects are exposed to. The rigidity quality of the resin will arise from the nature of the molecule serving as the monomer, and/or oligomer, and/or polymer in the ink formulation; for instance rigid moieties in the monomer and/or oligomer and/or polymer backbone will give the final resin matrix its rigidity, such as phenyl ring or cycloheptene or cyclohexane moieties, the same goes for double or triple carbon-carbon bonds which will render the polymeric chain from rotating and will impose a though and rigid structure. Examples for that can be epoxy derived acrylates, cyclohexane derived acrylates etc. In addition and as indicated additional properties (e.g., dielectric constant, loss tangent, fire resistance, scratch resistance, etc.) can be imparted to the rigid resin when using either conjugates, derivatives, copolymers, or terpolymers of the aforementioned polymers (and others) at specific ratios in the ink formulation. To clarify, the term "conjugate", as used herein, refers to any compound that has been formed by the joining of two or more moieties not necessarily on the polymer backbone. A "moiety" or "group" is any type of molecular arrangement designated by formula, chemical name, or structure. Within the context of certain embodiments, a conjugate is said to comprise one or more moieties or chemical groups. This means that the formula of the moiety is substituted at some place in order to be joined and be a part of the molecular arrangement of the conjugate. Although moieties may be directly covalently joined, it is not intended that the joining of two or more moieties must be directly to each other. A linking group, crosslinking group, or joining group refers to any molecular arrangement that will connect the moieties by covalent bonds such as, but are not limited to, one or more amide group(s), may join the moieties. Additionally, although the conjugate may be unsubstituted, the conjugate may have a variety of additional substituents connected to the linking groups and/or connected to the moieties. For example, siloxanes moieties are molecular arrangements containing silicon-oxygen bonds. Preferably, within certain embodiments, the siloxane moieties are caged structures.

Furthermore, and in another embodiment, crosslinking refers to joining moieties together by covalent bonding using a crosslinking agent, i.e., forming a linking group, or by the radical polymerization of monomers such as, but not limited to methacrylates, methacrylamides, acrylates, or acrylamides. In some embodiment, the linking groups are grown to the end of the polymer arms. In preferred embodiments, siloxane-polymers conjugates have alkenyl groups and are crosslinked by radical polymerization the absence or presence of other molecules that contain alkenyl groups, such as, but not limited to, methacrylates, methacrylamides, acrylates, or acrylamides and crosslinkers and radical, anionic, cationic initiators.

Furthermore, the term "copolymer" means a polymer derived from two or more monomers (including terpolymers, tetrapolymers, etc.), and the term "polymer" refers to any carbon-containing compound having repeat units from one or more different monomers.

Likewise, the flexible resin ink used in the rigid-flexible, or rigid-flexible-rigid electronic objects and FPCs described herein can be a composition comprising natural or synthetic rubber(s) Poly(hexafluorobutylmethacrylate), poly(siloxane) (PS), polydimethylsiloxane (PDMS) poly(imide) (PI), Poly(tetraflouroethylene) (PTFE), poly(ethyleneterephthalate) (PET), poly(ethylenenaphthalate) (PEN), or a conjugate, a copolymer, a terpolymer, or a derivative comprising two or more of the foregoing.

The flexible resin ink can also be a composition of monomer and/or oligomer and or polymeric solution, based on long aliphatic chains, where the number of carbon is between 4 to 30, preferably between 4 to 20, which can allow for free rotation of the polymeric backbone, as well as bending and twisting of the polymer. ethylene glycol based monomer, oligomers and polymers may also serve to give flexibility to the obtained resin. Likewise, high elongation properties of urethan based polymer may serve as well to give flexibility to the resin. These types of oligomers and/or monomers, will be functionalized to give a polymeric matrix, optionally with a ready polymer. The degree of curing will also be used to control over the flexibility property.

In an embodiment, the flexible conductive ink is a composition comprising an elastomer or elastomer solution, or a mere solvent with a flexible conductive filler material; and a conductive filler. The elastomer can be, for example natural rubber (NR), styrene butadiene rubber (SBR), ethylene-propylene-diene monomer (EPDM), polyurethane (PU), and poly(dimethylsiloxane) (PDMS) are characterized by high, reversible deformation (>200%) and poor conductivity. The "rubber" can be any material that is considered by persons skilled in the art to be a "rubber", preferably crosslinkable rubber (e.g., prior to impregnation with filler material). For example, the rubber component can be any olefin-containing rubber such as ethylene-propylene copolymers (EPM). Other rubber components can include ethylene-propylene-diene (EPDM) rubber, or EPDM-type rubber, for example. An EPDM-type rubber can be terpolymer derived from the polymerization of at least two different monoolefin monomers having from 2 to 10 carbon atoms, preferably 2 to 4 carbon atoms, and at least one polyunsaturated olefin having from 5 to 20 carbon atoms.

The filler can be either organic or inorganic. For example, the filler can be silver nanofibers or (Ag) nanowires, carbon black, single-wall carbon nanotube (SWCNT), multiwall carbon-nanotube (MWCNT), diamond thread, graphene nanoparticles, a conductive polymer e.g., polyaniline, or a combination comprising one or more of the foregoing. These fillers may be used in an embodiment to increase the conductivity of the flexible resin and/or elastomers used in the inks described. These fillers may be used in certain embodiments to also affect mechanical properties. To increase the conductivity, the fractional concentration of the fillers is maintained in an embodiment above the 3D percolation threshold. In an embodiment, the fractional concentration of the filler needed to impart the required conductivity is lower for a single-wall carbon nanotube (SWCNT), multiwall carbon-nanotube (MWCNT), diamond thread, or a conductive polymer, than carbon black. Other doping fillers can be, for example iodine (I2) and antimony pentachloride (SbCl5), for example, with EPDM or SBR.

Likewise, the conductive polymer resin used in the methods, compositions and systems described herein can have a filler such as metallic nanoparticles suspended within the elastomeric or flexible polymer portion or within a solvent. The nanoparticles can be in the shape of flakes, spheres rods, wires or their combination. As described herein, the aspect ratio of the suspended nanoparticles can be much larger than 1, which may beneficially affect (reduce) their percolation threshold.

In an embodiment, the polymer filler portion of the conductive polymer resin composition used in the rigid-flexible, or rigid-flexible-rigid electronic objects and FPCs described herein can be, for example, poly(acetylene) (PA), poly(aniline) (PANI), poly(pyrrole) (PPY), poly(3,4-ethylene dioxythiophene) (PEDOT), poly(4,4'-oxydiphenylene-pyromellitimide) or a conjugate, a copolymer, a terpolymer, or a derivative comprising two or more of the foregoing. The filler polymer can form an interpenetrating network whereby the elastomer can provide the flexibility required and the conductive polymer filler provides the required.

For example, the conductive polymer resin used in the flexible conductive resin ink compositions described herein can be a Poly(urethane)-poly(3,4-ethylene dioxythiophene) blend, with the PEDOT having a fractional concentration (v/v) above the 3D percolation threshold, for example between about 10% and about 16% PEDOT/PU. The actual percolation threshold will depend on the weight average molecular weight ($\overline{MW}_W$), the number average molecular weight ($\overline{MW}_N$) and the polydispersity index (PDI) of the PU and PEDOT. For reference purposes, the term "flexible conductive resin" refers to polymer resin composition capable of exhibiting above 99 S/cm under elongation of at least 10%. The flexible conductive ink compositions described herein can further comprise miscibility enhancing polymers, for example poly(ethyleneoxide) (PEO).

Likewise, other functional heads may be located before, between or after the rigid and or flexible resin print head and/or the rigid metallic (metal containing) or flexible conducting print head(s). These may include a source of electromagnetic radiation configured to emit electromagnetic radiation at a predetermined wavelength ($\lambda$), for example, between 190 nm and about 400 nm, e.g. 395 nm which in an embodiment, can be used to accelerate and/or modulate and/or facilitate a photopolymerizable rigid and/or flexible (dielectric, non-conducting) resin that can be used in conjunction with metal nanoparticles dispersion used in the rigid metallic ink. Other functional heads can be heating elements, additional printing heads with various inks (e.g., support, pre-soldering connective ink, label printing of various components for example capacitors, transistors and the like) and a combination of the foregoing.

As indicated, the systems used to implement the methods for fabricating rigid-flexible and/or rigid-flexible-rigid electronic objects and their components can have additional rigid metallic ink print heads, which may contain different metals. For example, the second print head as described herein can comprise a Silver (Ag) nanoparticles while an additional print head for metallic ink may comprise different metal, e.g., Copper, or Gold. Likewise, other metals (e.g., Al) or metal precursors can also be used and the examples provided should not be considered as limiting.

Similarly, the additional print head(s) can be dedicated to delivering a different flexible conductive material, for example, in the third print head the flexible conductive material can be a 12% PEDOT:PU blend, while the additional print head dedicated to the delivery and formation of another flexible conductive portion can be SBR:SWCNT (~20% SWCNT).

Accordingly, the inkjet printing system further comprises additional print head having: at least one aperture, a second rigid metallic ink or flexible conductive ink reservoir, and a second rigid metallic ink or flexible conductive ink pump configured to supply the second rigid metallic ink or flexible conductive ink through the aperture, the method further comprising: providing a second rigid metallic ink or flexible conductive ink composition; using the second rigid metallic ink or flexible conductive ink print head, forming a predetermined pattern corresponding to the second rigid metallic or flexible conductive representation in the first, substantially 2D layer of the rigid-flexible electronic object for printing; and sintering, and/or solidifying and/or crosslinking and/or irradiating the predetermined pattern corresponding to the second rigid metallic or flexible conductive representation in the 2D layer of the rigid-flexible electronic object, wherein the second rigid metallic ink or flexible conductive ink composition has a different metal or flexible conductive composition than the rigid metallic ink or flexible conductive ink composition in the third or fourth print head. Consequently, the methods can further comprise providing a second metallic ink composition; using the second metallic ink print head, forming a predetermined pattern corresponding to the second metal representation in the first, substantially 2D layer of the composite component for printing; and sintering the predetermined pattern corresponding to the second metal representation in the 2D layer of the composite component. The second metallic ink composition can have a different metal than the rigid metallic ink composition in the second print head, or in another embodiment; and in order to achieve higher throughput, the second metallic ink composition can be identical in all metallic print heads.

In addition, all printing heads and the method of forming the rigid-flexible and/or rigid-flexible-rigid electronic objects described herein, can be configured to take place in a housing having controlled atmosphere therein. Likewise, the controlled atmosphere can be affected by the rigid and/or flexible resin ink compositions.

Other similar functional steps (and therefore means for affecting these steps) may be taken before or after each of the resin ink or metallic ink print heads (e.g., for sintering the rigid metallic layer). These steps may include (but not limited to): a heating step (affected by a heating element, or hot air); photobleaching (of a photoresist mask support pattern), photocuring, or exposure to any other appropriate actininc radiation source (using e.g., a UV light source); drying (e.g., using vacuum region, or heating element); (reactive) plasma deposition (e.g., using pressurized plasma gun and a plasma beam controller); cross linking such as by using cationic initiator e.g. [4-[(2-hydroxytetradecyl)-oxyl]-phenyl]-phenyliodonium hexafluoro antimonate to a flexible resin polymer solutions or flexible conductive resin solutions; prior to coating; annealing, or facilitating redox reactions and their combination regardless of the order in which these processes are utilized. In certain embodiment, a laser (for example, selective laser sintering/melting, direct laser sintering/melting), or electron-beam melting can be used on the rigid resin, and/or the flexible portion. It should be noted, that sintering of the rigid metallic portions can take place even under circumstances whereby the rigid metallic portions are printed on top of a rigid resinous portion of the rigid-flexible and/or rigid-flexible-rigid electronic objects described herein component.

It should be noted, that, in the rigid portion of the rigid-flexible and/or rigid-flexible-rigid electronic objects described herein described herein; rigid metallic layers can be (simultaneously and directly) deposited among the rigid resin layers, separately and distinct from a coating pattern above the resin layer. For example, a rigid metallic layer can be deposited over a support layer, which following removal, will be independent of any resin material. Similarly, in the flexible portion of the rigid-flexible and/or rigid-flexible-rigid electronic objects described herein described herein, the flexible conductive material can be deposited either simultaneously or consecutively with a flexible resin and each can be functionalized (in other words, solidified, cured and/or crosslinked) with the same or different functional print heads.

Accordingly, in an embodiment, the steps of using the second print head and depositing the rigid metallic inkjet ink onto a substrate, or if so required, onto a chuck, thereby forming a first printed rigid metallic (conductive) pattern layer and/or the step of depositing the rigid resin-containing inkjet ink onto the removable substrate (or chuck), and/or or removable support, is preceded, followed or takes place concurrently with a step of heating, photocuring drying, depositing plasma, cross linking, annealing, facilitating redox reactions, sintering, melting or a combination of steps comprising one or more of the foregoing. The pre-, or post portion treatment (in other words, functionalizing the rigid resin and/or rigid metallic and/or optional support portions) can take place either before or after the step of using the flexible portions' print head(s), the additional rigid or flexible resin ink print head(s), the additional metallic ink print head(s), or the flexible conducting inkjet inks or in any other permutation.

Formulating the rigid metallic ink composition (and the flexible conducting resin inkjet ink), may take into account the requirements, if any, imposed by the deposition tool (e.g., in terms of viscosity and surface tension of the composition) and the deposition surface characteristics (e.g., hydrophilic or hydrophobic, and the interfacial energy of the peelable or removable substrate or the support material if used), or the substrate layer on which consecutive layers are deposited. Using ink-jet printing with a piezo head, the viscosity of either the rigid metallic ink and/or the resin-forming inkjet ink (measured at the printing temperature ° C.) can be, for example, not lower than about 5 cP, e.g., not lower than about 8 cP, or not lower than about 10 cP, and not higher than about 30 cP, e.g., not higher than about 20 cP, or not higher than about 15 cP. The rigid metallic ink, can each be configured (e.g., formulated) to have a dynamic surface tension (referring to a surface tension when an ink-jet ink droplet is formed at the print-head aperture) of between about 25 mN/m and about 40 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate, the support material, the resin layer(s), or their combination, of between about 100° and about 165°.

Using a metallic composition in the methods of fabricating rigid-flexible and/or rigid-flexible-rigid electronic objects as described herein, can be composed essentially of solvent-suspended metallic copper, silver, aluminum nanoparticles, or metallic inkjet ink compositions comprising one or more of the foregoing and other metals (e.g., Group IA (1) of the periodic table), a binder, and a solvent, wherein the diameter, shape and composition ratio of the nanoparticles in the ink are optimized, thus enabling the formation of a layer, or dense printed pattern. It should be noted that choice of metal ink will depend on the final characteristics of the 3D composite component sought to be printed. These particles can be in a size range suitable for the desired applications. In an embodiment, rigid metallic portion patterns formed using silver are printed using inks of nanosilver suspensions. The rigid metallic portion of the 2D representation of the rigid-flexible and/or rigid-flexible-rigid electronic objects described herein can be significantly enhanced in quality during sintering by, for example, the silver nanoparticles having thin or small features with high aspect ratios (e.g., flakes or rods). In other words, by having metallic nanoparticles with aspect ratio R is much higher than 1 ($R \gg 1$). Having the high aspect ratio can create an alignment of the nanoparticles due to, for example, flow orientation of the ink in the direction of motion of the substrate on a chuck, or in another embodiment, by the ejection process from the print head's orifice.

In an embodiment, the term "chuck" is intended to mean a mechanism for supporting, holding, or retaining a substrate or a workpiece. The chuck may include one or more pieces. In one embodiment, the chuck may include a combination of a stage and an insert, a platform, be jacketed or otherwise be configured for heating and/or cooling and have another similar component, or any combination thereof.

In an embodiment, the ink-jet ink compositions, systems and methods allowing for a direct, continuous or semi-continuous ink-jet printing of a rigid-flexible and/or rigid-flexible-rigid electronic objects can be patterned by expelling droplets of the liquid ink-jet ink provided herein from an orifice one-at-a-time, as the print-head (or the substrate) is maneuvered, for example in two (X-Y) (it should be understood that the print head can also move in the Z axis) dimensions at a predetermined distance above the removable substrate or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an embodiment, from within a well operably coupled to the orifice. The printing of the first inkjet metallic ink can be additive and can accommodate a greater number of layers. The ink-jet print heads provided used in the methods described herein can provide a minimum layer film thickness equal to or less than about 3 µm-10,000 µm.

Similarly, the term "contacting" is used in an embodiment to refer to materials which may be blended, mixed, slurried, dissolved, reacted, treated, or otherwise contacted in some other manner. Therefore, the term "contacting" encompasses the "reacting" of two or more components, and it also encompasses the "mixing" or "blending" of two or more components that do not react with one another.

The conveyor maneuvering among the various print heads used in the methods described and implementable in the systems described can be configured to move at a velocity of between about 5 mm/sec and about 1000 mm/sec. The velocity of the e.g., chuck can depend, for example, on: the desired throughput, the number of print heads used in the process, the number and thickness of layers of the rigid-flexible and/or rigid-flexible-rigid electronic objects described herein printed, the curing time of the ink, the evaporation rate of the ink solvents, the distance between the print head(s) containing the first ink-jet rigid metallic ink of the metal particles or metallic polymer paste and the second print head comprising the second, thermoset resin and board forming inkjet ink, and the like or a combination of factors comprising one or more of the foregoing.

In an embodiment, the dynamic viscosity of the various inks can each be between about 0.1 and about 30 cP·s (mPa·s), for example the final ink formulation can have a viscosity of 8-12 cP·s at the working temperature, which can be controlled. For example, the metallic nanoparticles dispersion, solution, emulsion, suspension, or liquid composition comprising the foregoing, or the resin inkjet ink can each be between about 5 cP·s and about 25 cP·s, or between about 7 cP·s and about 20 cP·s, specifically, between about 8 cP·s and about 15 cP·s.

In an embodiment, the volume of each droplet of the metallic (or metallic) ink, and/or the second, resin ink, can range from 0.5 to 300 picoLiter (pL), for example 1-4 pL and depended on the strength of the driving pulse and the properties of the ink. The waveform to expel a single droplet can be a 10V to about 70 V pulse, or about 16V to about 20V, and can be expelled at frequencies between about 2 kHz and about 500 kHz.

The rigid resin inks can be configured to be stable within a print head reservoir. For example, the solid contents (i.e., suspended solids if colloidal suspension, or solute if a solution) can be between about 5 wt % and about 100 wt %. In certain embodiments, surfactants may not be necessary and the ink can be 100% active, by incorporating photoactive monomers/oligomers and their combination, in which no appreciable sedimentation can take place. Further, the ink viscosity can be adjusted to facilitate ejection of droplets. Accordingly, in an embodiment, the surface energy ($\gamma$) together with dynamic viscosity ($\mu$) of the resin ink solutions used in the methods of forming the rigid-flexible and/or rigid-flexible-rigid electronic objects described herein can be in the range of between about 25 mN/m and about 35 mN/m and between about 8 mNs/m$^2$ (cP) and about 15 mNs/m$^2$ (cP), respectively. Inks used in certain embodiments, which are comprised of suspended sub-micron particles, for example in the pigment coloring inks and metallic particles inks, as well as, in some embodiments, the resin inks can be configured to facilitate optimal operation as determined by some thresholds (e.g., nozzle orifice and nozzle neck) inside micro liquid channels of the print head(s).

In an embodiment, the cross-linking agent, co-monomer, co-oligomer, co-polymer or a composition comprising one or more of the foregoing and is used in the rigid and/or flexible and/or flexible conducting resin ink(s) provided, can be a part, or configured to form a solution, emulsion, or suspension within the resinous ink compositions.

The printed pattern of the rigid and/or flexible and/or flexible conducting resin ink(s) portion can be fabricated from resin-rich ink compositions, for example, suspensions, emulsions, solutions and the like. The term "resin-rich" refers to compositions in which larger proportions of polymer resin components are included than are needed to bind the pigment particles to each other and the resin layer to the underlying substrate, or another composite component layer, or support portion and their combination. For example, a resin-rich component layer may include polymer resins in amounts that are at least 95% by weight of the total resin ink weight including pigments. In those circumstances requiring that pigments be provided by a separate coloring print-head (s), resin-rich ink compositions can have up to 99.9% active monomers, oligomers and their combination.

As described, the parameters used in the step of selection of parameters related to the Rigid-Flexible PCBs and/or FPCs performed by the CAM module used for the fabrication of the rigid-flexible and/or rigid-flexible-rigid electronic objects described herein, can be, for example: the parameters used in the selection of parameters related to the rigid-flexible electronic object are; the rigid resin pattern in the layer, the rigid metallic pattern in the layer, the flexible resin layer, the flexible conductive resin pattern, curing requirements for the rigid resin, crosslinking requirements for the flexible resin, sintering for the rigid metallic pattern in the layer, curing/and/or irradiating requirements for the flexible conductive resin, throughput requirement, or a combination of parameters comprising one or more of the foregoing.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple (remote) locations.

The CAM module can comprise: a 2D file library storing the files converted from the 3D visualization files of the composite component; a processor in communication with the library; a memory device storing a set of operational instructions for execution by the processor; a micromechanical inkjet print head or heads in communication with the processor and with the library; and a print head (or, heads') interface circuit in communication with the 2D file library, the memory and the micromechanical inkjet print head or heads, the 2D file library configured to provide printer operation parameters specific to a functional layer; pre-processing Computer-Aided Design/Computer-Aided Manufacturing (CAD/CAM) generated information associated with the 3D resin metallic rigid-flexible and/or rigid-flexible-rigid electronic objects to be fabricated, thereby obtaining a plurality of 2D file; loading the plurality of 2D file s processed in the step of pre-processing from the composite component 3D visualization files onto the 2D file library; and using the 2D file library, instructing the processor to print the predetermined layer of the composite component in a predetermined order.

The 3D visualization file representing the composite component used for the fabrication of the rigid-flexible and/or rigid-flexible-rigid electronic objects described herein, can be: an .asm, an STL, an IGES, a STEP, a Catia, a SolidWorks, a ProE, a 3D Studio, a Gerber, a Rhino file or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

In certain embodiments, the CAM module further comprises a computer program product for fabricating one or more rigid-flexible and/or rigid-flexible-rigid electronic objects, for example, an electronic component, machine part, a connector (see e.g., FIGS. 1, 2) and the like. The printed component can comprise both discrete metallic components and resinous components that are each and both being printed optionally simultaneously or sequentially and continuously, on either a rigid portion or a flexible portion of the PCB and/or FPC. The term "continuous" and its variants are intended to mean printing in a substantially unbroken process. In another embodiment, continuous refers to a layer, member, or structure in which no significant breaks in the layer, member, or structure lie along its length.

The computer controlling the printing process described herein can comprise: a computer readable storage medium having computer readable program code embodied therewith, the computer readable program code when executed by a processor in a digital computing device causes a three-dimensional inkjet printing unit to perform the steps of: pre-processing Computer-Aided Design/Computer-Aided Manufacturing (CAD/CAM) generated information associated with the rigid-flexible and/or rigid-flexible-rigid electronic objects described herein (in other words, the 3D visualization file representing the composite component) to be fabricated, thereby obtaining a plurality of 2D files (in other words, the file that represents at least one, substantially 2D layer for printing the composite component), each 2D file specific for a predetermined layer in a specific order; loading the plurality of 2D file s processed in the step of pre-processing onto a 2D file library; directing a stream of droplets of a metallic material from a first inkjet print head of the three-dimensional inkjet printing unit at a surface of a substrate; directing a stream of droplets of a colored resin material from a second inkjet print head of the three-dimensional inkjet printing unit at the surface of the substrate; alternatively or additionally directing a stream of droplets of a coloring material from a third inkjet print head of the three-dimensional inkjet printing unit at a surface of the metallic pattern and/or the resin pattern and/or a support portion pattern; optionally directing a stream of droplets of a support material from a fourth inkjet print head of the three-dimensional inkjet printing unit at a surface of the metallic pattern and/or the resin pattern; moving the first, second, optionally third, and optionally fourth inkjet heads relative to the substrate in an x-y plane of the substrate, wherein the step of moving the first, second, optionally third, and optionally fourth inkjet heads relative to the substrate in the x-y plane of the substrate, for each of a plurality of layers is performed in a layer-by-layer fabrication of the rigid-flexible and/or rigid-flexible-rigid electronic objects described herein on the substrate.

In addition, the computer program, can comprise program code means for carrying out the steps of the methods described herein, as well as a computer program product comprising program code means stored on a medium that can be read by a computer, such as a floppy disk, a hard disk, CD-ROM, DVD, USB memory stick, or a storage medium that can be accessed via a data network, such as the Internet or Intranet, when the computer program product is loaded in the main memory of a computer and is carried out by the computer.

Memory device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc. The memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library can reside on a memory device that is remote from the CAM module coupled to the 3D inkjet printer provided, and be accessible by the 3D inkjet printer provided (for example, by a wide area network).

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, resin or metal/metallic) layers.

Furthermore, as used herein, the term "2D file library" refers to a given set of files that together define a single rigid-flexible and/or rigid-flexible-rigid electronic objects, or a plurality of rigid-flexible and/or rigid-flexible-rigid electronic objects used for a given purpose. The term can also be used to refer to a set of 2D files or any other raster graphic file format (the representation of images as a collection of pixels, generally in the form of a rectangular grid, e.g., BMP, PNG, TIFF, GIF), capable of being indexed, searched, and reassembled to provide the structural layers of a given rigid-flexible and/or rigid-flexible-rigid electronic objects,—whether the search is for the rigid-flexible and/or rigid-flexible-rigid electronic objects described herein, or a given specific layer.

The Computer-Aided Design/Computer-Aided Manufacturing (CAD/CAM) generated information associated with the rigid-flexible and/or rigid-flexible-rigid electronic objects described herein to be fabricated used in the methods, programs and libraries for using inkjet printing based on converted CAD/CAM data packages can be, for example, IGES, DXF, DMIS, NC files, GERBER® files, EXCELLON®, STL, EPRT files, an .asm, a STEP, a Catia, a SolidWorks, a ProE, a 3D Studio, a Rhino file or a package comprising one or more of the foregoing. Additionally, attributes attached to the graphics objects transfer the meta-information needed for fabrication and can precisely define the rigid-flexible and/or rigid-flexible-rigid electronic objects described herein image and the structure and color of the image (e.g., resin or metal), resulting in an efficient and effective transfer of fabrication data from design (3D visualization CAD e.g.,) to fabrication (CAM e.g.,). Accordingly and in an embodiment, using pre-processing algorithm, GERBER®, EXCELLON®, DWG, DXF, STL, EPRT ASM, and the like as described herein, are converted to 2D files.

EXAMPLES

Example I. Flexible Conductive Ink

Composition: Silver Nanoparticles (between about 20% and about 60% (w/w)) were admixed with polyether acrylate (between about 0.1% and about 5% (w/w)) and photoinitiator(s) (between about 1% and about 5% (w/w)), as well as carbon nanotubes (CNT, between about 0.1% and about 1% (w/w)) and dispersant (e.g., block copolymer at a ratio to CNT of between about 4:1 and 1:2), and solubilized/dispersed/suspended in solvent (Dipropylene Glycol Monomethyl Ether, to 100%).

Process: 800 layers (0.27 mm) were printed on polyester substrate placed on a heated chuck (between about 120° C. and about 190° C.) using inkjet printer as described hereinabove forming a rectangle (35×35×0.27 mm). The each layer was exposed to UV light for polymerization and an IR source for sintering.

Figure 5:
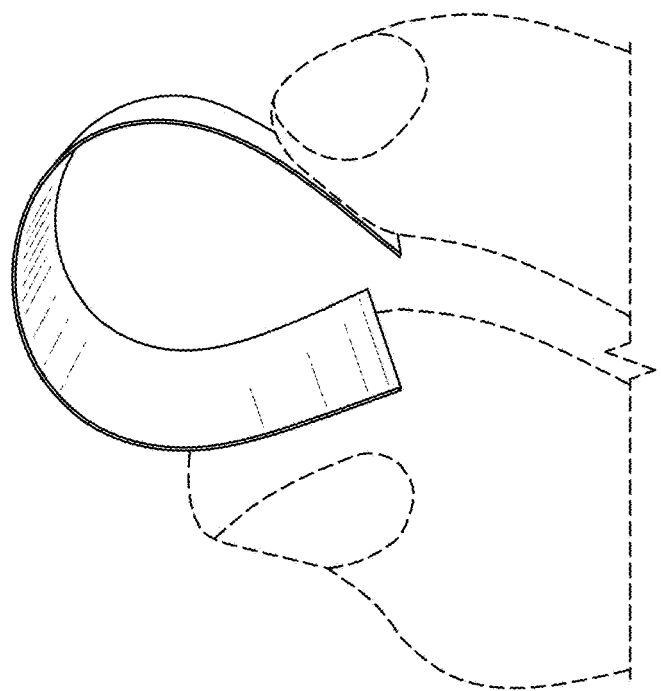
FIG. 5, shows the bending radius of a flexible conductive strip fabricated using an embodiment of the methods and compositions described.
Figure 6:
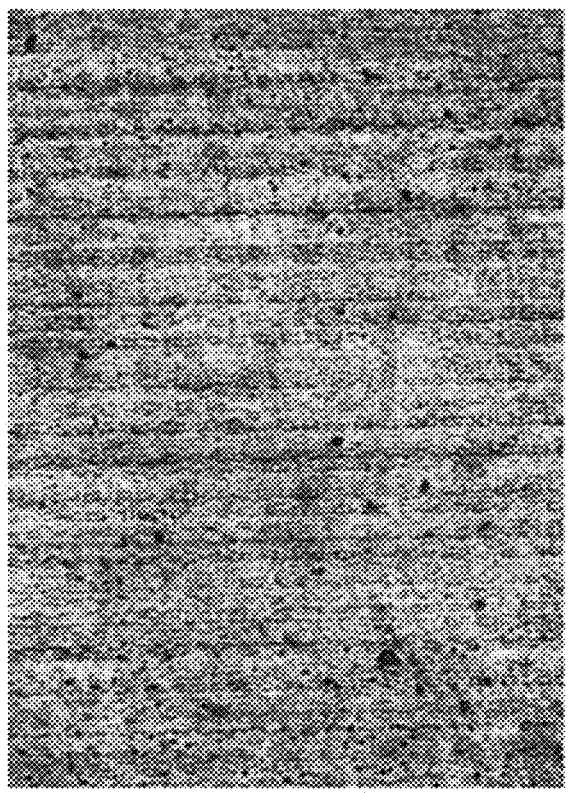
FIG. 6, shows a top plan view of the strip in FIG. 5 after 50 repeated bending to 8 mm radius.

Results: As illustrated in FIG. 5, the cured and sintered sample exhibited a bending radius of 8 mm, without any cracks and/or delamination showing. As shown in FIG. 6, repeated bending of the strip to the same radius (~8 mm) showed that no cracks or layer delamination resulted. The conductive flexible ink formulation produced ink having surface tension of about 22 mN/m.

Example II. Flexible Printed Circuit

Figure 7:
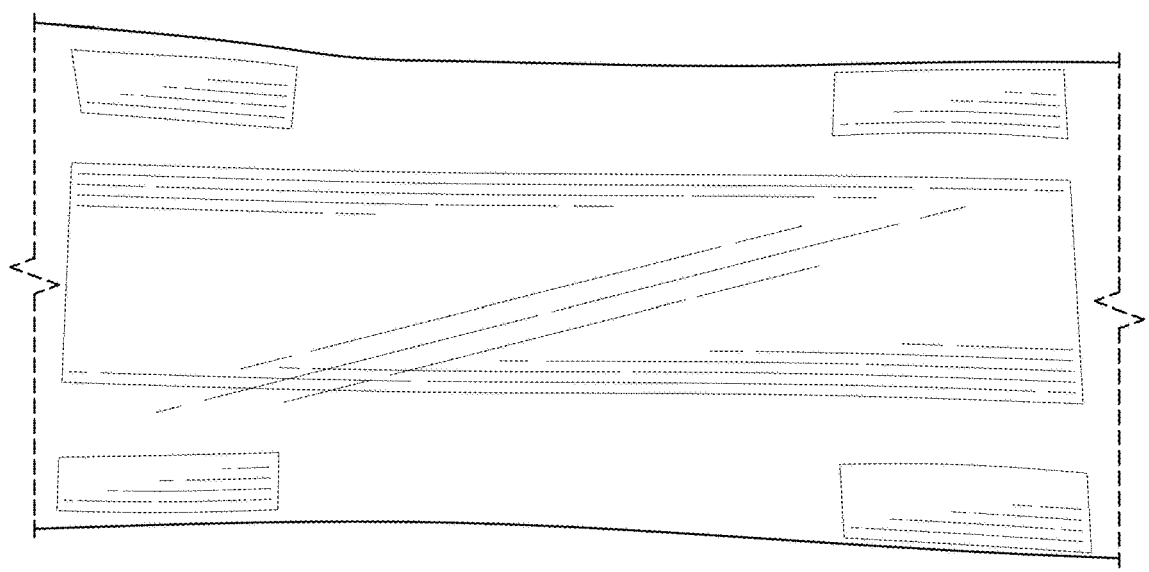
FIG. 7, illustrates a FPC fabricated using an embodiment of the compositions and methods described.
Figure 8:
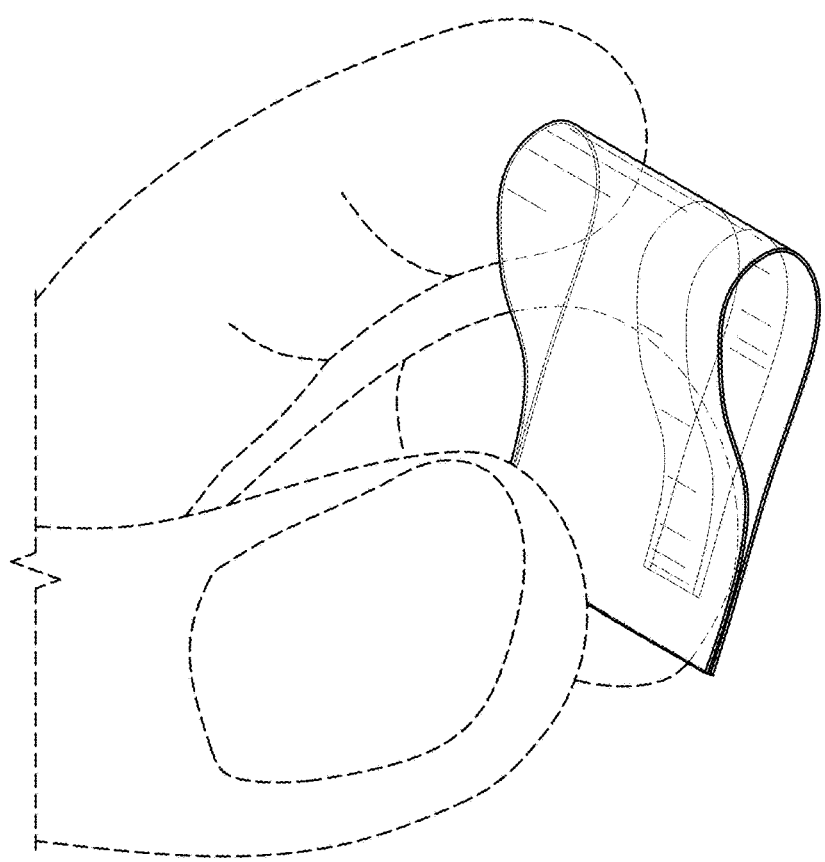
FIG. 8, shows the bending radius of the FPC of FIG. 7.

The conductive ink in Example 1 was used to print FPC as described herein by printing the conductive ink on a substrate fabricated using flexible ink formulation comprising 100% (no solvent) combination of: isopropy-lthioxanthone (ITX); Ethyl-4-dimethylamino benzoate; (EDAB); dypropylene glycol diacrylate; tricyclodecane dimethanol diacrylate; urethane acrylate oligomer(s); aliphatic urethane diacrylate; acrylate ester; 2-[(butylcarbamoyl)oxy]ethyl acrylate; dendritic acrylate oligomers; and aromatic urethane acrylate oligomer. Results are illustrated in FIGS. 7, and 8.

50 layers of the conductive ink produced FPC of 16 μm conductive traces produced a strip that had a bending radius of 2 mm (see e.g., FIG. 8), with trace (0.3 mm×0.15 mm) resistance of 2 OHM/cm. The dielectric flexible ink formulation produced ink having surface tension of about 35 mN/m, with Young's modulus of about 1.9 and about 2.7 mPa, tensile strength of between about 12.5 and about 15 mPa, and percent elongation at break of between about 23% and about 30%.

Figure 9:
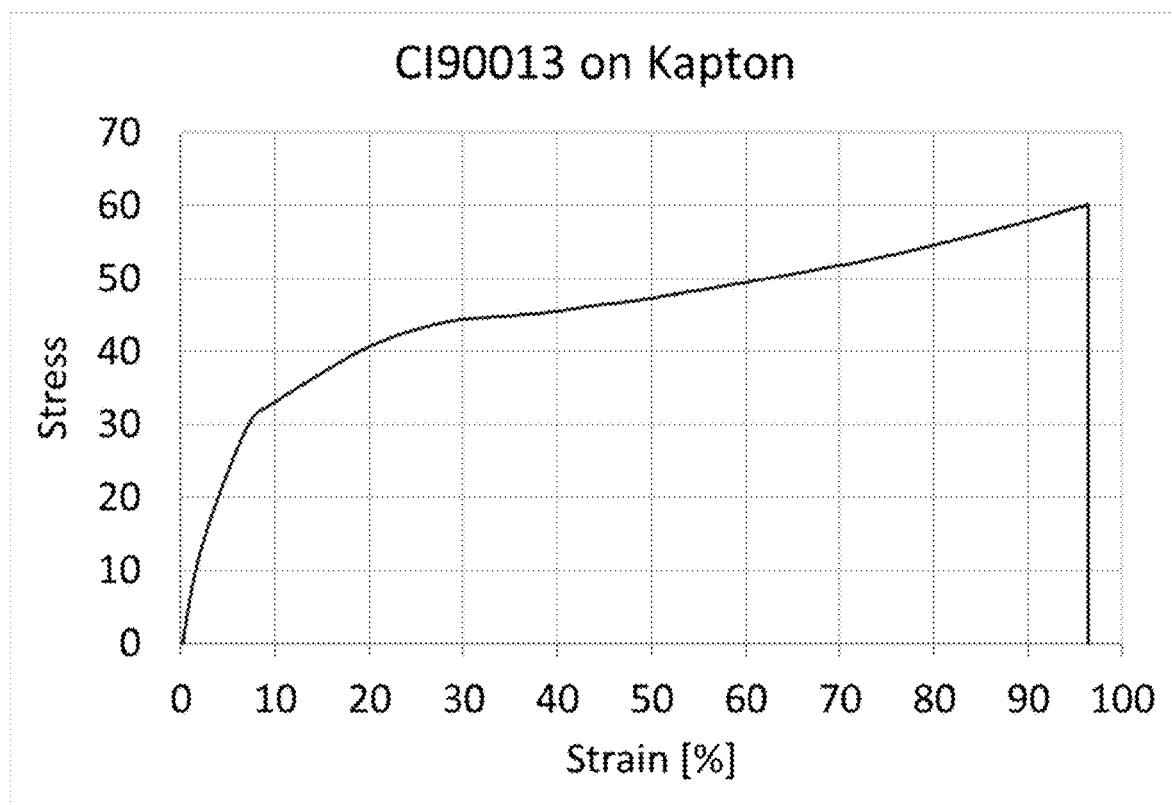
FIG. 9, shows results of a yield test on the FPC of FIG. 7.

Young's modulus refers generally to the ratio of a simple tension stress applied to a material to the resulting strain parallel to the tension. The Young's modulus is also a measure of the modulus of the elasticity for the material which modulus of elasticity may also be known as the coefficient of elasticity, the elasticity modulus or the elastic modulus. Stress/Strain analysis for the conductive ink printed in Example I on Kaptone is shown in FIG. 9, showing 8% elongation at the yield point and 30% elongation at break point.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the print head(s) includes one or more print head). Reference throughout the specification to "one embodiment", "another embodiment", "an embodiment", and so forth, when present, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly and in an embodiment, provided herein is a method for fabricating a rigid-flexible electronic object using inkjet printer comprising: providing an ink jet printing system comprising: a first print head having: at least one aperture, a rigid resin ink reservoir, and a rigid resin pump configured to supply rigid resin inkjet ink through the aperture; a second print head having: at least one aperture, a rigid metallic ink reservoir, and a rigid metallic ink pump configured to supply the rigid metallic inkjet ink through the aperture; a third print head having: at least one aperture, a flexible resin ink reservoir, and a flexible resin ink pump configured to supply the flexible resin inkjet ink through the aperture; a fourth print head having: at least one aperture, a flexible conductive ink reservoir, and a flexible conductive ink pump configured to supply the flexible conductive inkjet ink through the aperture; a conveyor, operably coupled to the first, the second, the third, and the fourth print heads configured to convey a substrate to each of the first, second, third, and fourth print heads; and a computer aided manufacturing ("CAM") module, comprising: a data processor; a non-volatile memory; and a set of executable instructions stored on the non-volatile memory for: receiving a 3D visualization file representing the rigid-flexible electronic object; generating a file that represents at least one, substantially 2D layer for printing the rigid-flexible electronic object; receiving a selection of parameters related to the rigid-flexible electronic object; and altering the file represents at least one, substantially 2D layer based on at least one of the selection of parameters, wherein the CAM module is configured to control each of the first, second, third and fourth print heads; providing the rigid resin inkjet ink composition, the rigid metallic inkjet ink composition, the flexible resin ink composition, and the flexible conductive ink composition; using the CAM module, obtaining a generated file representing a first, substantially 2D layer of the rigid-flexible electronic object for printing, the 2D layer comprising a pattern representative of the rigid resin inkjet ink, the rigid metallic inkjet ink, the flexible resin inkjet ink, the flexible conductive inkjet ink, or a combination comprising two or more; using the first print head, forming the pattern corresponding to the rigid resin representation in the first, substantially 2D layer of the rigid-flexible electronic object for printing; curing the pattern corresponding to the rigid resin representation in the 2D layer of the rigid-flexible electronic object; using the third print head, forming the pattern corresponding to the flexible resin representation in the first, substantially 2D layer of the rigid-flexible electronic object for printing; cross-linking the pattern corresponding to the flexible resin representation in the 2D layer of the rigid-flexible electronic object; using the second print head, forming the pattern corresponding to the rigid metallic ink representation in the first, substantially 2D layer of the rigid-flexible electronic object for printing; sintering the pattern corresponding to the rigid metallic ink representation in the first, substantially 2D layer of the rigid-flexible electronic object for printing; using the fourth print head, forming the pattern corresponding to the flexible conductive ink representation in the first, substantially 2D layer of the rigid-flexible electronic object for printing; and cross-linking the pattern corresponding to the flexible conductive representation in the 2D layer of the rigid-flexible electronic object; further comprising (i) using the CAM module, obtaining a generated file representing a, substantially 2D layer of the rigid-flexible electronic object for printing subsequent to the first layer; and repeating the steps for forming a subsequent composite component layer, wherein (ii) the step of curing the first layer comprises heating, photopolymerizing, drying, depositing plasma, annealing, facilitating redox reaction, or a combination comprising one or more of the foregoing, wherein (iii) the rigid metallic ink composition comprises: metal nanoparticles having average diameter $D_{2,1}$ particle size between about 20 nm and about 150 nm; and optionally a solvent, (iv) the aspect ratio of the metal nanoparticles is substantially larger than 1, wherein (v) the rigid resin ink is a solution of a multifunctional acrylate monomer, oligomer, polymer or their combination; a cross-linking agent (e.g., a radical, a monomer, oligomer or their combination); and a radical photoinitiator, (vi) the rigid resin is: polyester (PES), polyethylene (PE), polyvinyl alcohol (PVOH), poly(vinylacetate) (PVA), poly-methyl methacrylate (PMMA), Poly(vinylpirrolidone), or a combination comprising a mixture or a copolymer of one or more of the foregoing, wherein (vii) the flexible resin ink is a composition comprising Poly (hexafluoro butylmethacrylate), poly(siloxane) (PS), poly(imide) (PI), Poly(tetraflouroethylene) (PTFE), poly(ethyleneterephthalate) (PET), poly(ethylenenaphthalate) (PEN), poly(4,4'-oxydiphenylene-pyromellitimide), or a conjugate, a copolymer, a terpolymer, or a derivative comprising two or more of the foregoing, wherein (viii) the flexible conductive ink is a composition comprising an elastomer; and a conductive filler, (ix) the elastomer is: poly(dimethylsiloxane) (PDMS), styrene butadiene rubber (SBR), ethylene-propylene-diene monomer (EPDM), polyurethane (PU), or a conjugate, a copolymer, a terpolymer, or a derivative comprising two or more of the foregoing, wherein (x) the filler is carbon black, single-wall carbon nanotube (SWCNT), multiwall carbon-nanotube (MWCNT), a carbon nanoribbon, diamond thread, a conductive polymer, or a combination comprising one or more of the foregoing, wherein (xi) the conductive polymer is poly(acetylene) (PA), poly(aniline) (PANI), poly(pyrrole) (PPY), poly(3,4-ethylene dioxythiophene) (PEDOT), or a conjugate, a copolymer, a terpolymer, or a derivative comprising two or more of the foregoing, wherein (xii) the parameters used in the selection of parameters related to the rigid-flexible electronic object are; the rigid resin pattern in the layer, the rigid metallic pattern in the layer, the flexible resin layer, the flexible conductive resin pattern, curing requirements for the rigid resin, crosslinking requirements for the flexible resin, sintering for the rigid metallic pattern in the layer, curing/and/or irradiating requirements for the flexible conductive resin, throughput requirement, or a combination of parameters comprising one or more of the foregoing, wherein (xiii) the 3D visualization file representing the rigid-flexible electronic object is an .asm, an STL, an IGES, a STEP, a Catia, a SolidWorks, a ProE, a 3D Studio, a Gerber, a Rhino file or a file comprising one or more of the foregoing; and wherein file tat represents at least one, substantially 2D layer is a JPEG, a GIF, a TIFF, a BMP, a PDF file, or a combination comprising one or more of the foregoing, wherein (xiv) the inkjet printing system further comprises an additional print head having: at least one aperture, a second rigid or flexible resin ink reservoir, and a second rigid or flexible resin ink pump configured to supply the second rigid or flexible resin ink through the aperture, the method further comprising: providing a second rigid or flexible resin ink composition; using the second rigid or flexible resin ink print head, forming a predetermined pattern corresponding to the second rigid or flexible resin representation in the first, substantially 2D layer of the rigid-flexible electronic object for printing; and curing or crosslinking the predetermined pattern corresponding to the second rigid or flexible resin representation in the 2D layer of the rigid-flexible electronic object, wherein the second rigid or flexible resin ink composition has a different rigid or flexible resin composition than the rigid or flexible resin ink composition in the first or second print head, (xv) the inkjet printing system further comprises an additional print head having: at least one aperture, a second rigid metallic ink or flexible conductive ink reservoir, and a second rigid metallic ink or flexible conductive ink pump configured to supply the second rigid metallic ink or flexible conductive ink through the aperture, the method further comprising: providing a second rigid metallic ink or flexible conductive ink composition; using the second rigid metallic ink or flexible conductive ink print head, forming a predetermined pattern corresponding to the second rigid metallic or flexible conductive representation in the first, substantially 2D layer of the rigid-flexible electronic object for printing; and sintering, and/or crosslinking and/or irradiating the predetermined pattern corresponding to the second rigid metallic or flexible conductive representation in the 2D layer of the rigid-flexible electronic object, wherein the second rigid metallic ink or flexible conductive ink composition has a different metal or flexible conductive composition than the rigid metallic ink or flexible conductive ink composition in the third or fourth print head, (xvi) the inkjet printing system further comprises an additional print head having: at least one aperture, a support ink reservoir, and a support ink pump configured to supply the support ink through the aperture, the method further comprising: providing a support ink composition; before, simultaneously with, or subsequent to the step of using the first print head and/or the second and/or the third print heads and/or the fourth print head, using the support ink print head, forming a predetermined pattern corresponding to the support representation in the first, substantially 2D layer of the rigid-flexible electronic object for printing; and functionalizing the predetermined pattern corresponding to the support representation in the 2D layer of the rigid-flexible electronic object.

Although the foregoing disclosure for 3D printing of rigid-flexible and/or rigid-flexible-rigid electronic objects using inkjet printing based on converted 3D visualization CAD/CAM data packages has been described in terms of some embodiments, other embodiments will be apparent to those of ordinary skill in the art from the disclosure herein. Moreover, the described embodiments have been presented by way of example only, and are not intended to limit the scope of the inventions. Indeed, the novel methods, programs, libraries and systems described herein may be embodied in a variety of other forms without departing from the spirit thereof. Accordingly, other combinations, omissions, substitutions and modifications will be apparent to the skilled artisan in view of the disclosure herein.

What is claimed:

1. A method for fabricating a rigid-flexible electronic object using inkjet printer comprising:
    a. providing an ink jet printing system comprising:
        i. a first print head having: at least one aperture, a rigid resin ink reservoir, and a rigid resin pump configured to supply rigid resin inkjet ink through the aperture;
        ii. a second print head having: at least one aperture, a rigid metallic ink reservoir, and a rigid metallic ink pump configured to supply the rigid metallic inkjet ink through the aperture;
        iii. a third print head having: at least one aperture, a flexible resin ink reservoir, and a flexible resin ink pump configured to supply the flexible resin inkjet ink through the aperture;
        iv. a fourth print head having: at least one aperture, a flexible conductive ink reservoir, and a flexible conductive ink pump configured to supply the flexible conductive inkjet ink through the aperture;
        v. a conveyor, operably coupled to the first, the second, the third, and the fourth print heads configured to convey a substrate to each of the first, second, third, and fourth print heads; and
        vi. a computer aided manufacturing ("CAM") module, comprising: a data processor; a non-volatile memory; and a set of executable instructions stored on the non-volatile memory for: receiving a 3D visualization file representing the rigid-flexible electronic object; generating a file that represents at least one, substantially 2D layer for printing the rigid-flexible electronic object; receiving a selection of parameters related to the rigid-flexible electronic object; and altering the file represents at least one, substantially 2D layer based on at least one of the selection of parameters,
    wherein the CAM module is configured to control each of the first, second, third and fourth print heads;
    b. providing the rigid resin inkjet ink composition, the rigid metallic inkjet ink composition, the flexible resin ink composition, and the flexible conductive ink composition;
    c. using the CAM module, obtaining a generated file representing a first, substantially 2D layer of the rigid-flexible electronic object for printing, the 2D layer comprising a pattern representative of the rigid resin inkjet ink, the rigid metallic inkjet ink, the flexible resin inkjet ink, the flexible conductive inkjet ink, or a combination comprising two or more;
    d. using the first print head, forming the pattern corresponding to the rigid resin representation in the first, substantially 2D layer of the rigid-flexible electronic object for printing;
    e. curing the pattern corresponding to the rigid resin representation in the 2D layer of the rigid-flexible electronic object;
    f. using the third print head, forming the pattern corresponding to the flexible resin representation in the first, substantially 2D layer of the rigid-flexible electronic object for printing;
    g. cross-linking the pattern corresponding to the flexible resin representation in the 2D layer of the rigid-flexible electronic object;
    h. using the second print head, forming the pattern corresponding to the rigid metallic ink representation in the first, substantially 2D layer of the rigid-flexible electronic object for printing;
    i. sintering the pattern corresponding to the rigid metallic ink representation in the first, substantially 2D layer of the rigid-flexible electronic object for printing;
    j. using the fourth print head, forming the pattern corresponding to the flexible conductive ink representation in the first, substantially 2D layer of the rigid-flexible electronic object for printing; and
    k. cross-linking the pattern corresponding to the flexible conductive representation in the 2D layer of the rigid-flexible electronic object.

2. The method of claim 1, further comprising:
    a. using the CAM module, obtaining a generated file representing a, substantially 2D layer of the rigid-flexible electronic object for printing subsequent to the first layer; and
    b. repeating the steps for forming a subsequent composite component layer.

3. The method of claim 2, wherein the step of curing the first layer comprises heating, photopolymerizing, drying, depositing plasma, annealing, facilitating redox reaction, or a combination comprising one or more of the foregoing.

4. The method of claim 3, wherein the rigid metallic ink composition comprises:
    metal nanoparticles having average diameter $D_{2,1}$ particle size between about 20 nm and about 150 nm; and optionally a solvent.

5. The method of claim 4, wherein the aspect ratio of the metal nanoparticles is substantially larger than 1.

6. The method of claim 5, wherein the rigid resin ink is a solution of a multifunctional acrylate monomer, oligomer, polymer or their combination; a cross-linking agent; and a radical photinitiator.

7. The method of claim 6, wherein the rigid resin is: polyester (PES), polyethylene (PE), polyvinyl alcohol (PVOH), poly(vinylacetate) (PVA), poly-methyl methacrylate (PMMA), Poly(vinylpirrolidone), or a combination comprising a mixture or a copolymer of one or more of the foregoing.

8. The method of claim 7, wherein the flexible resin ink is a composition comprising Poly(hexafluorobutylmethacrylate), poly(siloxane) (PS), poly(imide) (PI), Poly(tetraflouroethylene) (PTFE), poly(ethyleneterephthalate) (PET), poly(ethylenenaphthalate) (PEN), poly(4,4'-oxydiphenylene-pyromellitimide), or a conjugate, a copolymer, a terpolymer, or a derivative comprising two or more of the foregoing.

9. The method of claim 8, wherein the flexible conductive ink is a composition comprising an elastomer; and a conductive filler.

10. The method of claim 9, wherein the elastomer is: poly(dimethylsiloxane) (PDMS), styrene butadiene rubber (SBR), ethylene-propylene-diene monomer (EPDM), polyurethane (PU), or a conjugate, a copolymer, a terpolymer, or a derivative comprising two or more of the foregoing.

11. The method of claim 9, wherein the filler is carbon black, single-wall carbon nanotube (SWCNT), multiwall carbon-nanotube (MWCNT), diamond thread, a conductive polymer, or a combination comprising one or more of the foregoing.

12. The method of claim 11, wherein the conductive polymer is poly(acetylene) (PA), poly(aniline) (PANI), poly (pyrrole) (PPY), poly(3,4-ethylene dioxythiophene) (PEDOT), or a conjugate, a copolymer, a terpolymer, or a derivative comprising two or more of the foregoing.

13. The method of claim 12, wherein the parameters used in the selection of parameters related to the rigid-flexible electronic object are; the rigid resin pattern in the layer, the rigid metallic pattern in the layer, the flexible resin layer, the flexible conductive resin pattern, curing requirements for the rigid resin, crosslinking requirements for the flexible resin, sintering for the rigid metallic pattern in the layer, curing/ and/or irradiating requirements for the flexible conductive resin, throughput requirement, or a combination of parameters comprising one or more of the foregoing.

14. The method of any one of claims 1, wherein the 3D visualization file representing the rigid-flexible electronic object is an .asm, an STL, an IGES, a STEP, a Catia, a SolidWorks, a ProE, a 3D Studio, a Gerber, a Rhino file or a file comprising one or more of the foregoing; and wherein file that represents at least one, substantially 2D layer is a JPEG, a GIF, a TIFF, a BMP, a PDF file, or a combination comprising one or more of the foregoing.

15. The method of claim 1, wherein the inkjet printing system further comprises an additional print head having: at least one aperture, a second rigid or flexible resin ink reservoir, and a second rigid or flexible resin ink pump configured to supply the second rigid or flexible resin ink through the aperture, the method further comprising:
   a. providing a second rigid or flexible resin ink composition;
   b. using the second rigid or flexible resin ink print head, forming a predetermined pattern corresponding to the second rigid or flexible resin representation in the first, substantially 2D layer of the rigid-flexible electronic object for printing; and
   c. curing or crosslinking the predetermined pattern corresponding to the second rigid or flexible resin representation in the 2D layer of the rigid-flexible electronic object, wherein the second rigid or flexible resin ink composition has a different rigid or flexible resin composition than the rigid or flexible resin ink composition in the first or second print head.

16. The method of claim 1, wherein the inkjet printing system further comprises an additional print head having: at least one aperture, a second rigid metallic ink or flexible conductive ink reservoir, and a second rigid metallic ink or flexible conductive ink pump configured to supply the second rigid metallic ink or flexible conductive ink through the aperture, the method further comprising:
   a. providing a second rigid metallic ink or flexible conductive ink composition;
   b. using the second rigid metallic ink or flexible conductive ink print head, forming a predetermined pattern corresponding to the second rigid metallic or flexible conductive representation in the first, substantially 2D layer of the rigid-flexible electronic object for printing; and
   c. sintering, and/or crosslinking and/or irradiating the predetermined pattern corresponding to the second rigid metallic or flexible conductive representation in the 2D layer of the rigid-flexible electronic object, wherein the second rigid metallic ink or flexible conductive ink composition has a different metal or flexible conductive composition than the rigid metallic ink or flexible conductive ink composition in the third or fourth print head.

17. The method of claim 1, wherein the inkjet printing system further comprises an additional print head having: at least one aperture, a support ink reservoir, and a support ink pump configured to supply the support ink through the aperture, the method further comprising:
   a. providing a support ink composition;
   b. before, simultaneously with, or subsequent to the step of using the first print head and/or the second and/or the third print heads and/or the fourth print head, using the support ink print head, forming a predetermined pattern corresponding to the support representation in the first, substantially 2D layer of the rigid-flexible electronic object for printing; and
   c. functionalizing the predetermined pattern corresponding to the support representation in the 2D layer of the rigid-flexible electronic object.

* * * * *